United States Patent [19]

Fichter

[11] 4,200,812
[45] Apr. 29, 1980

[54] FREQUENCY CONVERTER DELIVERING CONSTANT WIDTH OUTPUT PULSES WITHIN VARIABLE DUTY CYCLES

[75] Inventor: Manfred Fichter, Königsfeld, Fed. Rep. of Germany

[73] Assignee: Kienzle Apparate GmbH, Villingen, Fed. Rep. of Germany

[21] Appl. No.: 868,863

[22] Filed: Jan. 12, 1978

[30] Foreign Application Priority Data

Jan. 15, 1977 [DE] Fed. Rep. of Germany ....... 2701575

[51] Int. Cl.² .................. H03K 1/18; H03K 4/02; H03K 25/06
[52] U.S. Cl. .................. 307/265; 307/220 R; 307/246
[58] Field of Search ............ 307/220 R, 225 R, 227, 307/265, 266, 267, 246

[56] References Cited

U.S. PATENT DOCUMENTS

| | | | |
|---|---|---|---|
| 3,105,158 | 9/1963 | Nichols | 307/227 X |
| 3,111,591 | 11/1963 | Conron et al. | 307/225 R |
| 3,304,439 | 2/1967 | Stratton et al. | 307/225 R |
| 3,819,955 | 6/1974 | Hilbert | 307/225 R |

Primary Examiner—John S. Heyman
Attorney, Agent, or Firm—Toren, McGeady and Stanger

[57] ABSTRACT

In the disclosed frequency converter, a pulse shaper receives pulses at the input frequency and changes their pulse widths to a predetermined value. An integrator integrates the reshaped pulses. An ultra high resistance triggering stage applies the voltage output of the integrator to a monostable multivibrator which is fired each time the voltage output of the integrator exceeds a predetermined value. The multivibrator forms pulses which turn on a discharge circuit that rapidly resets the integrator with each multivibrator output pulse. The multivibrator output pulses appear at the attenuated frequency which is established by, and can be infinitely varied by, stepless change of the predetermined pulse widths.

4 Claims, 7 Drawing Figures

1

FREQUENCY CONVERTER DELIVERING CONSTANT WIDTH OUTPUT PULSES WITHIN VARIABLE DUTY CYCLES

BACKGROUND OF THE INVENTION

This invention relates to a frequency attenuator or converter, i.e. divider, with an infinitely variable reduction ratio.

Such frequency converters may, for example, be used in tachometers and tachographs, i.e., with apparatuses which record or indicate a rotational or linear speed, or measure a distance covered, or any combination of these.

When speed is measured electronically, a suitable pulse generator must transmit at least a sufficient number of pulses per unit distance, using a reasonable number of circuit elements, so that a steady speed indication exists even when the speed is low. However, these high frequencies required for speed measurement are not necessary for measuring distances. For that, a pulse rate of one pulse per 100 meters is adequate. In fact, the high frequencies suitable for speed measurements are incompatible with the need of distance measuring devices using distance indicators or other readout devices using a stepping motor or other electromechanical driving device. That is to say, a motor or electromechanical driver may not be able to respond to pulses at high repetition rates. The frequency of the pulses must either be reduced or special pulse generators must be used.

For purposes of production as well as inventory organization, known indicating or recording apparatuses of this type are usually adapted for operation in response to definite number of input pulses per revolution or a definite number of pulses per unit distance. This number of pulses per revolution or pulses per unit distance can be considered an input constant. However, vehicles do not often deliver pulse rates that correspond to such an input constant. Vehicles and vehicle connections vary. Depending on the type of vehicle, different numbers of revolutions per unit distance may be sensed at difference places between the vehicle wheel and the motor. The position at which sensing takes place is determined by the vehicle manufacturer. Moreover, the same type of vehicle may operate with various sizes of tires, or the vehicle maker may utilize pulse generators having varying numbers of pulses per revolution.

It is possible to accommodate these variations in pulse rates by providing a specific frequency divider, for each particular situation. However, this is not very advisable. Rather, each tachograph or tachometer should have associated therewith a frequency transducer with an infinitely variable (continuously variable) reduction ratio over a specific frequency range. In this way a tachograph or tachometer can operate with the pulse frequencies produced by virtually any pulse generator of any vehicle.

Of course, it is also possible to obtain a substantially exact adaptation of pulse rates on a stepwise basis by changing gears in a reduction gear arrangement inserted between the drive shaft and the indicating rollers of a device such as a distance indicator in a tachograph. It is also possible to adjust for different pulse rates by changing gears in a gear arrangement that drives the pulse generator. This type of structure is usual when the revolution count is transmitted by mechanical driving means.

However, when processing data electronically, such mechanical devices are highly unsatisfactory. This is so not only because of the transmission errors inherent in such mechanical systems, but also because of the expense of production, mounting, and storing, the large number of gear combinations. Furthermore, gearing demands a great deal of effort insofar as organizing the arrangement is concerned.

According to one known circuit of arrangement, programmable electronic switching means effect the desired frequency adjustment by issuing a definite number of counting pulses of high frequency for each pulse generator input pulse. The number of high frequency pulses is determined by the desired reduction ratio. This is a simple manner of permitting adjustment of the pulses delivered from the vehicle driven pulse generator to the tachograph or tachometer input constant. Apart from the necessary pulse forming stage, such an arrangement requires an oscillator, and to obtain the required accuracy, a multistage counter and a multistage switching circuit, as well as a comparison circuit. It is as accurate as the usual mechanical adjusting means. It is, therefore, too expensive for normal use in view of the fact that the sum of the pulses produced for each generator input pulse must be reduced decadically at a later stage to permit further processing.

Another arrangement of this kind attempts to use less expensive electronic circuitry. However, it still requires an oscillator which produces counting pulses of higher frequency than the generator frequency. However, the output frequency must again be reduced to achieve a sensible operating frequency. Here the reduction ratio is defined by a monostable multivibrator producing pulses of an adjustable pulse width in response to the control of the generator pulses. This circuitry permits high accuracy only at relatively high counting frequencies and at great expense which results from the frequency reduction means. Apart from the above, the accuracy of the circuit is dependent upon the oscillator maintaining a constant frequency and avoiding the influence of temperatures upon the monostable multivibrator. Additional difficulties might arise from extraneous disturbances becasue this system must be used in a vehicle.

SUMMARY OF THE INVENTION

An object of the present invention is to provide a frequency attenuator optimally adapted to its field of application and composed of as few circuit parts in as simple a circuit arrangement as possible, operable without failure and with a negligible error rate.

According to a feature of the invention, a pulse shaper responds to input pulses by producing pulses of a predetermined width, an integrator integrates the resulting pulses, and a monostable multivibrator produces a series of pulses each in response to the integrator reaching a predetermined value, this pulse series constituting the attenuated frequency output signal and at the same time serving to trigger discharge of the integrator, while an extremely high resistance triggering stage couples the integrating stage and the monostable multivibrator.

According to other features of the invention, the integrator is manually variable, has a capacitor smaller than 0.2 $\mu f$, and the stage coupling the integrator with the multivibrator is in the form of a C-MOS module triggering stage.

These and other features of the invention will be pointed out in the claims. Other objects and advantages of the invention will become evident from the following detailed description when read in light of the accompanying drawings.

DETAILED DESCRIPTION OF PREFERRED EMBODIMENTS

Figure 1:
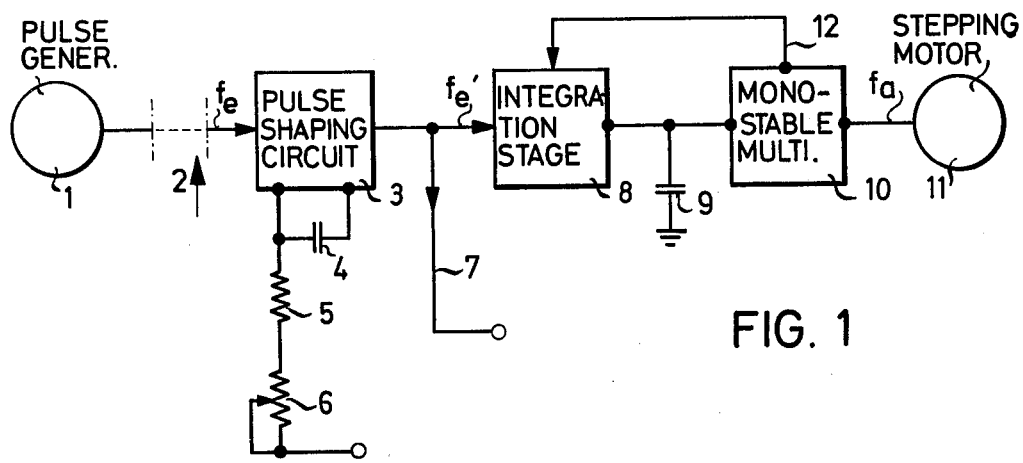
FIG. 1 is a block diagram illustrating a system embodying features of the invention.
Figure 3A:
FIGS. 3a to 3d are graphs illustrating variations in voltages at various points in the circuit of FIG. 1

In FIG. 1, a pulse generator 1 is mounted on a vehicle and driven in dependence upon the distance covered by the vehicle. According to one embodiment of the invention, the pulse generator 1 is driven by a wheel shaft or drive shaft of the vehicle. The pulse generator 1 produces a definite number of pulses for each unit distance covered by the vehicle. A transmission line 2 transmits the signals to a pulse shaping circuit 3. The signals transmitted by the transmission line 2 may have a wide range of pulse shapes and duty cycles and are illustrated in FIG. 3a. The signals generated by the pulse generator 1 occur at a frequency $f_e$ which naturally changes with the vehicle travel speed.

Figure 3B:

The pulse shaping circuit 3 includes a capacitor 4, a fixed resistor 5, and a variable resistor 6 which form a variable RC circuit. The pulse shaping circuit 3 with its RC circuit 4, 5, and 6, shapes the pulses so they exhibit a specific pulse width such as $t_1$ illustrated in FIG. 3b. The latter shows the pulse output of the pulse shaping circuit 3. These pulses at the output of the pulse shaping circuit are delivered simultaneously to the input of a speed measuring circuit, not shown, at a frequency $f_e'$ as well as to the input of a charge and discharge circuit 8 of an integrating stage. In the integrator, a storage capacitor 9 integrates the shaped input pulses $f_e'$ which are delivered by a constant current, i.e., it cumulatively charges a specific amount in response to each pulse.

Figure 3C:
Figure 3D:
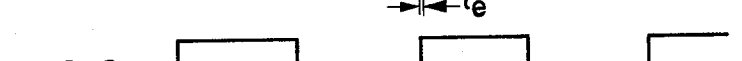

FIG. 3c illustrates the charging of the storage capacitor in steps in response to the pulses. When the capacitor voltage reaches a predetermined switching threshold V, a monostable multivibrator 10 produces an output pulse $t_2$ of predetermined pulse width. In accordance with the normal operation of a monostable multivibrator, the latter then returns to its other (or quiescent) state until triggered again when the capacitor voltage again reaches the value V. The threshold voltage V is established by selection of the circuit elements in the trigger input of the multivibrator 10. A feedback 12 applies the leading edge of the multivibrator output pulses to discharge the storage capacitor 9 and prepares the latter for the next storage cycle. The width $t_2$ of the multivibrator 10 output pulse is specifically preselected to be suitable for driving a stepping motor 11 mounted in a distance counter or measuring device. The frequency $f_a$, and hence the cyclic period $1/f_a$ varies on the basis of how often and how fast the input pulses to the integrator 8 change the capacitor 9 to trigger the monostable multivibrator.

Such frequency attenuators do, however, exhibit disadvantages. In practice, the reduction ratio $f_e/f_a$ is not generally an integer.

For a better understanding, it should be stated that for tachographs or tachometers to be driven by pulses a defined reduction ratio is preadjusted as an input constant for the distance measurement. This constant may be assumed as one pulse per meter. In that connection, it is necessary that the pulse width $t_2$ of the pulses controlling the stepping motor 11 must be sufficiently long for advancing the distance meter. On the other hand, of course, the output frequency $f_a$ of the frequency transducer must be slow enough to step the stepping motor 11 even at the maximum speed of the vehicle.

For speed measurement, a suitable type of pulse generator would be one which delivers something like eight pulses for each revolution of the generator shaft. On the other hand, a translatory to rotary speed conversion of "one" involves a single rotation of the vehicle drive shaft per meter, a range which in practice is common for such conversions. This results in an output of eight pulses per meter. The reduction ratio from $f_e$ to $f_a$ must, therefore, be 8 to 1.

If these assumed adjustments (8 pulses per meter) do not conform to the pulse count per meter delivered by the pulse generator, a conversion other than 1 "is necessary" or the pulse generator 1 must generate more or less pulses per rotation. Both measures may be necessary. Thus, on the one hand, the pulse widths $t_1$ of the pulses $f_e'$ are varied by means of the potentiometer 6, or on the other hand, the charging current is established so that the current time integral of the pulses per meter $(x + \Delta x)t$ always exhibits the same value. In this manner the reduction ratio of the frequency attenuator is modified and may reach a value, for example of 8.65 to 1.

As can be seen from FIGS. 1 and 3, the line 12 applies pulses $f_e'$ to the charge and discharge circuit 8. It is essential that these pulses which may occur during the charging phase of the storage capacitor 9 produce a complete discharge of the storage capacitor. It is also essential that any faults caused by the discharge time $t_e$ be within predetermined limits.

Figure 2:
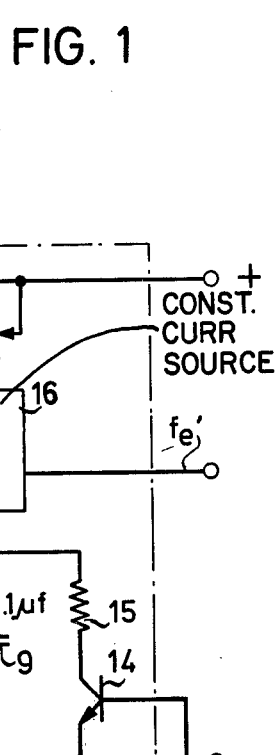
FIG. 2 is a partially block and partially schematic diagram illustrating a portion of the circuit in FIG. 1.

In view of the above, the arrangement must discharge the capacitor 9 very quickly. Hence, the capacitor must have a rather small capacitance. Fortunately, small capacitors have the advantage of being manufacturable with higher temperature stability and better aging characteristics than corresponding capacitors having high values. However, in order to compensate for the low capacitance of the storage capacitor 9, the input of the monostable multivibrator exhibits an extremely high resistance. This high resistance has an additional favorable effect upon the discharge of the storage capacitor 9 which occurs between two pulses of the frequency $f_e'$ as a result of the unavoidable input current $i_e$ of the multivibrator 10. That is, the high resistance minimizes this discharge and the accompanying errors and reduces them so that they lie within an acceptable range. For this purpose, as shown in FIG. 2, the multivibrator 10 is provided with an input trigger stage 13. The latter is composed of a C-MOS (complementary metal oxide semiconductor) semiconductor device having an input resistance of $10^{12}$ ohms. This stage reduces the input current $i_e$ to a range of 10 nA.

In FIG. 2, a transistor 14 and a resistor 15 form a discharge circuit in the circuit 8. This discharge circuit discharges the storage capacitor 9 in response to each switching pulse from the multivibrator 10. A constant current source 16 in the circuit 8 delivers the charging current and a variable resistor 17 controls the charging current to the storage capacitor 9. The source 16 may be replaced with a constant voltage source which would normally have a favorable temperature stability.

In a combination of modules of this kind, according to one embodiment of the invention, the value of the storage capacitor 9 is 0.1 microfarads which results in discharge times in the range of 1.5 microseconds. At high driving speeds, the counting mistakes would be approximately 1 percent and therefore negligible from a practical point of view. Preferably the value of the storage capacitor is at least 0.1 microfarads or less.

Figure 4:
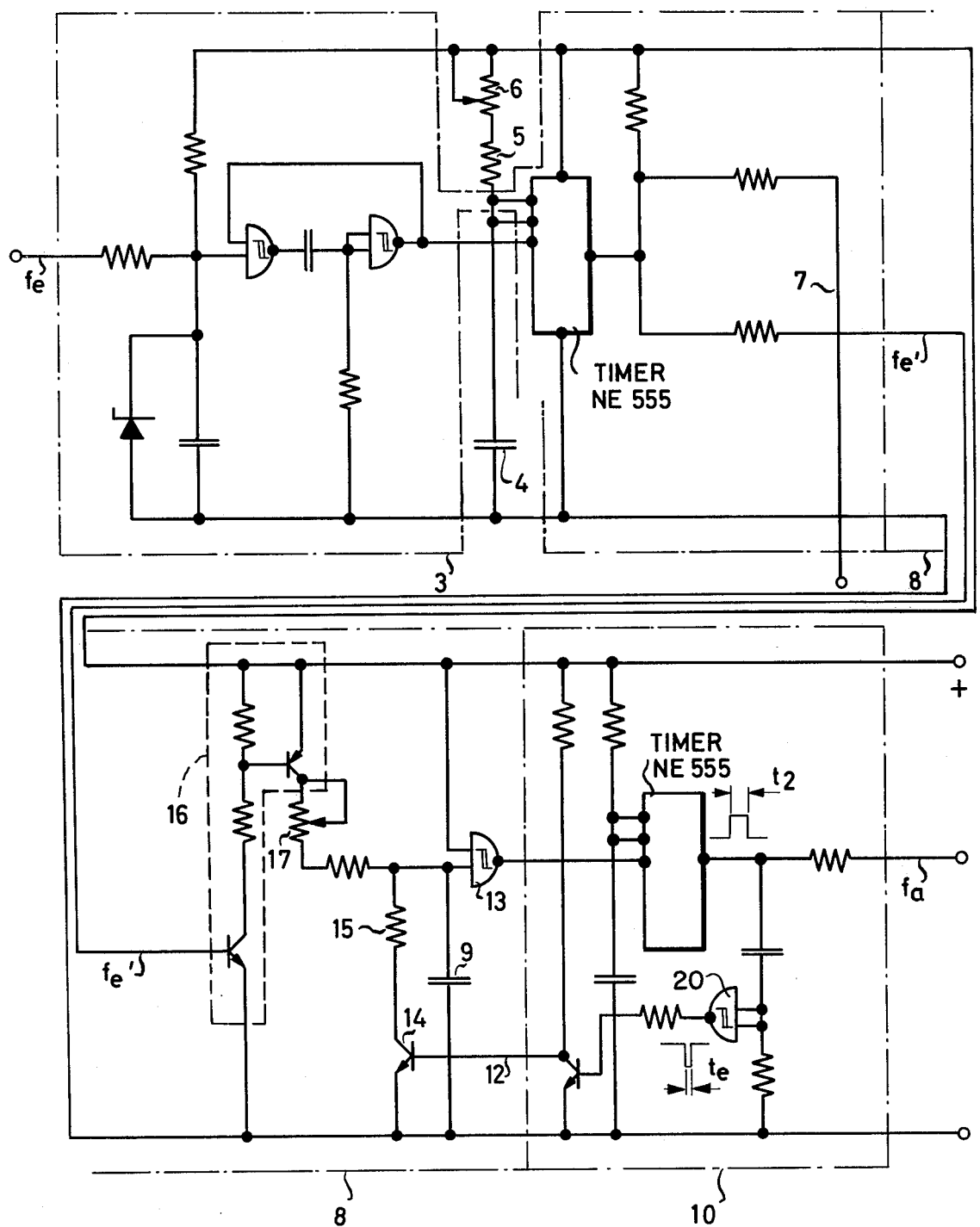
FIG. 4 is a schematic circuit diagram illustrating details of the elements in FIGS. 1 and 2.

FIG. 4 is a detailed schematic diagram of the circuits shown in FIGS. 1 and 2. Here the pulse shaping circuit is shown to be composed of two feedback connected gates, biasing resistors, and a zener diode. In the integration stage 8, the input $f_e'$ (i.e., the shaped pulses having the frequency $f_e$) switch the constant current source 16 on and off so that the latter charges the capacitor 9 at a rate predetermined by the resistor 17. When the capacitor 9 reaches a threshold determined by the gate 13, the time NE 555 produces the pulse whose width is $t_2$. As soon as the pulse is produced, a gate 21 generates a shorter pulse $t_e$ which a transistor and a line 12 apply to a transistor 14 so that the latter rapidly discharges the capacitor 9 for repeated charging. After the pulse $t_2$ has ended, no new pulse occurs until the capacitor 9 has again charged to the level V. As a result, the frequency of the output $f_a$ varies on the basis of the number of pulses entering the capacitor 9 and the charging rate of the capacitor 9. However, the width of the pulses $t_2$ remain constant. This changes the duty cycle of the pulses $t_2$ relative to the period $1/f_a$.

While embodiments of the invention have been described in detail it will be evident that the invention may be embodied otherwise without departing from its spirit and scope.

FIG. 4 illustrates details of the block diagrams of FIGS. 1 and 2.

What is claimed is:

1. A frequency transducer, comprising: pulse forming means for generating pulses with manually variable widths, integrating means coupled to said pulse forming means and having accumulator means responding to the widths of the pulses for forming output signals which are varied with the widths of the pulses from the pulse forming means, said integrating means including accumulator termination means coupled to said accumulator means for terminating the formation of the signal and reducing the value of the signal to an initial value when the termination means is actuated, monostable switching means coupled to said accumulator means for producing a pulse in response to the signal reaching a predetermined value, said switching means having an output connected to said termination means for actuating said termination means and returning the signal to an initial value, said pulse forming means producing pulses of one frequency and said switching means producing pulses of another frequency on the basis of the pulse widths, said switching means including a monostable multivibrator with an input and an output and further including an ultra-high resistance trigger stage connected between the input to the monostable multivibrator and the output of said integrating means.

2. A frequency divider as in claim 1, wherein the accumulator means includes a storage capacitor having a value less than 0.2 microfarads.

3. A frequency divider as in claims 1 and 2 wherein said trigger stage is a C-MOS module.

4. A frequency attenuator for attenuating an input frequency, comprising a pulse shaping circuit responsive to the input pulses and having manually variable time constant means for varying the widths of the pulses, an integrator coupled to said pulse shaping circuit for integrating the shaped pulses and producing an output signal which varies with the widths of the pulses, reset means coupled to the output of the integrator for resetting the integrator, monostable means coupled to the integrator and to the reset means for producing a pulse in response to the integrator output signal reaching a predetermined value and for producing a pulse which actuates said reset means to reset the integrator, said monostable means having an output, said monostable means including a monostable multivibrator connected to the output and the reset means and an ultra-high resistance trigger stage connecting the integrator with the multivibrator.

* * * * *